(12) United States Patent
Tsai

(10) Patent No.: US 8,134,067 B1
(45) Date of Patent: Mar. 13, 2012

(54) THIN FILM PHOTOVOLTAIC DEVICE

(76) Inventor: Chin-Yao Tsai, Tainan (TW)

(\*) Notice: Subject to any disclaimer, the term of this patent is extended or adjusted under 35 U.S.C. 154(b) by 0 days.

(21) Appl. No.: 13/186,842

(22) Filed: Jul. 20, 2011

Related U.S. Application Data

(60) Provisional application No. 61/434,885, filed on Jan. 21, 2011.

(51) Int. Cl.
*H01L 31/042* (2006.01)
(52) U.S. Cl. .................................................... 136/249
(58) Field of Classification Search .................... 136/249
See application file for complete search history.

(56) References Cited

U.S. PATENT DOCUMENTS

| | | | |
|---|---|---|---|
| 4,754,544 | A | 7/1988 | Hanak |
| 5,356,488 | A | 10/1994 | Hezel |
| 5,468,988 | A | 11/1995 | Glatfelter et al. |
| 5,512,107 | A | 4/1996 | van den Berg |
| 5,800,631 | A | 9/1998 | Yamada et al. |
| 6,274,804 | B1 | 8/2001 | Psyk et al. |
| 6,288,326 | B1 | 9/2001 | Hayashi et al. |
| 6,310,281 | B1 | 10/2001 | Wendt et al. |
| 6,924,427 | B2 | 8/2005 | Eckert et al. |
| 7,122,398 | B1 | 10/2006 | Pichler |
| 7,247,346 | B1 | 7/2007 | Sager et al. |
| 7,772,484 | B2 | 8/2010 | Li et al. |
| 7,928,317 | B2 | 4/2011 | Atanackovic |
| 2003/0062079 | A1 | 4/2003 | Blieske et al. |
| 2003/0180983 | A1 | 9/2003 | Oswald et al. |
| 2007/0295385 | A1 | 12/2007 | Sheats et al. |
| 2009/0056803 | A1* | 3/2009 | Nakai et al. ............... 136/256 |
| 2010/0131108 | A1 | 5/2010 | Meyer |
| 2010/0300532 | A1 | 12/2010 | Cumpston et al. |
| 2010/0313935 | A1* | 12/2010 | Coakley et al. ............ 136/249 |

FOREIGN PATENT DOCUMENTS

| | | |
|---|---|---|
| KR | 20080040607 A | 5/2008 |
| WO | 2008014492 A2 | 1/2008 |
| WO | 2008091890 A2 | 7/2008 |
| WO | 2009154473 A2 | 12/2009 |
| WO | 2010046180 A2 | 4/2010 |
| WO | 2010056764 A2 | 5/2010 |
| WO | 2010101810 A1 | 9/2010 |
| WO | 2010151364 A1 | 12/2010 |

\* cited by examiner

*Primary Examiner* — Mark F Huff
*Assistant Examiner* — Dustin Q Dam
(74) *Attorney, Agent, or Firm* — Morris Manning & Martin LLP; Tim Tingkang Xia, Esq.

(57) ABSTRACT

In one aspect, the present invention relates to a photovoltaic module. In one embodiment, the photovoltaic module includes a plurality of photovoltaic cells spatially formed on a substrate in an array along a transverse direction. Each photovoltaic cell has a first conductive layer formed on the substrate, having a first end portion and an opposite, second end portion defining a body portion therebetween, where the body portion has a first thickness and at least one of the first and second end portions has a second thickness being variable from the first thickness to zero along the transverse direction, an active layer at least partially formed on the first conductive layer and extending onto the substrate at the at least one end portion, and a second conductive layer at least partially formed on the active layer. The plurality of photovoltaic cells is electrically coupled to each other in series such that the second conductive layer in any one but the last photovoltaic cell is electrically connected to the first conductive layer of the immediately next photovoltaic cell.

12 Claims, 9 Drawing Sheets

THIN FILM PHOTOVOLTAIC DEVICE

CROSS-REFERENCE TO RELATED PATENT APPLICATION

This application claims priority to and the benefit of, pursuant to 35 U.S.C. §119(e), U.S. provisional patent application Ser. No. 61/434,885, filed Jan. 21, 2011, entitled "A PASSIVATION LAYER, A LAYERED STRUCTURE, METHODS OF MAKING AND APPLICATIONS OF THE SAME," by Chin-Yao Tsai, the content of which is incorporated herein in its entirety by reference.

FIELD OF THE INVENTION

The present invention relates generally to a photovoltaic device, and more particularly, to a thin film photovoltaic device that is resistant to corrosion caused by, among other things, moisture ingression.

BACKGROUND OF THE INVENTION

A photovoltaic cell converts the energy of sunlight into electricity by the photovoltaic effect. Assemblies of photovoltaic cells are used to make photovoltaic modules or solar panels. Most currently available photovoltaic cells are made from bulk materials such as crystalline silicon or polycrystalline silicon. Photovoltaic cells can also be made of thin film layers deposited on a substrate. Thin film photovoltaic cells reduce the amount of material required thus reducing material cost compared to bulk photovoltaic cells. Thin film photovoltaic cells are becoming increasingly popular due to their low cost, flexibility, light weight, and ease of integration.

Reliability has been a major concern for thin film photovoltaic modules in the solar energy industry. Quality control tests on some conventional thin film photovoltaic modules under damp heat have shown fast performance degradation as a function of test time manifested as an increase in series resistance ($R_S$) and a decrease in position at maximum power point ($P_{MPP}$). The cause of the degradation is determined to be due to delamination of the front conductive layer as a result of TCO corrosion after being exposed to humidity. One possible mechanism of the TCO corrosion is due to sodium reduction reactions occurring at the glass-TCO interface upon exposure to moisture in the surrounding environment. Another possible mechanism is due to the etching process caused by fluorine ions in fluorine tin oxide (FTO) upon exposure to moisture in the surrounding environment. Various wet encapsulation methods, including wrap sealant in the module frame, metal tape around the edges of the module, glass-glass bonding, and edge sealant, have been developed to prevent the TCO corrosion. Other methods, such as creating a diffusion barrier for sodium ions, have also been used. However, these methods have not been effective in solving the corrosion problem. Negative grounding is also used to lessen the corrosion problem. This method however is not cost effective because transformerless inverters cannot be used.

Therefore, a heretofore unaddressed need exists in the art to address the aforementioned deficiencies and inadequacies.

SUMMARY OF THE INVENTION

The present invention, in one aspect, relates to a thin film photovoltaic device. In one embodiment, the photovoltaic device has a substrate, a first conductive layer formed on the substrate with one or more curved edges at a boundary, an active layer at least partially formed on the first conductive layer, and a second conductive layer at least partially formed on the active layer, where the active layer covers the one or more curved edges of the first conductive layer such that the interface between the first conductive layer and the substrate is not exposed to a surrounding environment.

In one embodiment each of the one or more curved edges of the first conductive layer has a sloped profile, where the sloped profile can be characterized with a rounded step function. In one embodiment, the rounded portion of the sloped profile has a radius of curvature.

The first conductive layer comprises a transparent conducting oxide (TCO). The TCO comprises indium tin oxide (ITO), indium zinc oxide (IZO), indium tin zinc oxide (ITZO), zinc oxide (ZO), aluminum tin oxide (ATO), aluminum zinc oxide (AZO), cadmium indium oxide (CIO), cadmium zinc oxide (CZO), gallium zinc oxide (GZO), or fluorine tin oxide (FTO).

In another aspect, the present invention relates to a photovoltaic module. In one embodiment, the photovoltaic module includes a plurality of photovoltaic cells, $\{C_j\}$, spatially formed on a substrate in an array along a transverse direction, where j=1, 2, 3, . . . , N, and N is an integer greater than one. Each photovoltaic cell $C_j$ has a first conductive layer formed on the substrate, having a first end portion and an opposite, second end portion defining a body portion therebetween, where the body portion has a first thickness, H1, and at least one of the first and second end portions has a second thickness, H2, being variable along the transverse direction and satisfying with the relationship of H1≧H2>0. In one embodiment, the at least one end portion of the first conductive layer of each photovoltaic cell has a sloped profile, where the sloped portion comprises a rounded profile.

Each photovoltaic cell $C_j$ also has an active layer at least partially formed on the first conductive layer and extending onto the substrate at the at least one end portion, and a second conductive layer at least partially formed on the active layer.

The first conductive layer of any one but the last photovoltaic cell $C_k$ is spatially separated from that of its immediately next photovoltaic cell $C_{k+1}$ by a distance $D_k$, where k=1, 2, 3, . . . , (N−1). The distances satisfy the relationship of $D_1 \geq D_2 \geq D_3 \geq \ldots \geq D_{N-1}$ or $D_1 \leq D_2 \leq D_3 \leq \ldots \leq D_{N-1}$. Further, the active layer and the second conductive layer of any one but the last photovoltaic cell $C_{k+1}$ are spatially separated from that of its immediately next photovoltaic cell $C_{k+1}$ by a window that exposes a portion of the first conductive layer of the immediately next photovoltaic cell $C_{k+1}$. The plurality of photovoltaic cells is electrically coupled to each other in series such that the second conductive layer of any one but the last photovoltaic cell $C_k$ is electrically connected to the first conductive layer of its immediately next photovoltaic cell $C_{k+1}$.

Further, the photovoltaic module has a protection layer formed on the second conductive layers and extending onto the exposed portions of the first conductive layers of the plurality of photovoltaic cells such that each photovoltaic cell is hermetically sealed from a surrounding environment.

In yet another aspect, the present invention relates to a photovoltaic module. In one embodiment, the photovoltaic module includes a plurality of photovoltaic cells, $\{C_j\}$, spatially formed on a substrate in an array along a transverse direction, j=1, 2, 3, . . . , N.

Each photovoltaic cell $C_j$ has a first conductive layer formed on the substrate, having a first end portion and an opposite, second end portion defining a body portion therebetween, wherein the body portion has a first thickness, H1, and at least one of the first and second end portions has a second thickness, H2, being variable along the transverse direction and satisfying with the relationship of H1≧H2≦0, an active layer at least partially formed on the first conductive layer and extending onto the substrate at the at least one end portion, and a second conductive layer at least partially formed on the active layer. In one embodiment, the first conductive layer of any one but the last photovoltaic cell $C_k$ is spatially separated from that of its immediately next photovoltaic cell $C_{k+1}$ by a distance $D_k$, where k=1, 2, 3, ..., (N−1). The distances satisfy the relationship of $D_1 \geqq D_2 \geqq D_3 \geqq \ldots \geqq D_{N-1}$ or $D_1 \leqq D_2 \leqq D_3 \leqq \ldots \leqq D_{N-1}$.

According to the present invention, the plurality of photovoltaic cells is electrically coupled to each other in series such that the second conductive layer of any one but the last photovoltaic cell $C_k$ is electrically connected to the first conductive layer of its immediately next photovoltaic cell $C_{k+1}$.

In one embodiment, the at least one end portion of the first conductive layer of each photovoltaic cell has a sloped profile, where the sloped portion comprises a rounded profile. The first conductive layer of each photovoltaic cell comprises a transparent conducting oxide (TCO).

In one embodiment, the active layer of each photovoltaic cell has a first end portion and an opposite, second end portion defining a body portion therebetween, where at least one of the first and second end portions has a sloped profile.

In one embodiment, the second conductive layer of each photovoltaic cell has a first end portion and an opposite, second end portion defining a body portion therebetween, where at least one of the first and second end portions has a sloped profile.

In one embodiment, the plurality of photovoltaic cells is formed such that the active layer and the second conductive layer of any one but the last photovoltaic cell are spatially separated from that of its immediately next photovoltaic cell by a window that exposes a portion of the first conductive layer of the immediately next photovoltaic cell.

In addition, the photovoltaic module may have a protection layer formed on the second conductive layers and extending onto the exposed portions of the first conductive layers of the plurality of photovoltaic cells such that each photovoltaic cell is hermetically sealed from a surrounding environment, where the protection layer comprises silicon oxide, silicon nitride, silicon oxynitride, silicon carbide, or a combination thereof.

In a further aspect, the present invention relates to a photovoltaic module. In one embodiment, the photovoltaic module includes a plurality of photovoltaic cells spatially formed on a substrate in an array along a transverse direction with each two neighboring photovoltaic cells spatially separated by a gap therebewteen that exposes a portion of the substrate. The plurality of photovoltaic cells is electrically coupled to each other in series or in parallel.

Each photovoltaic cell comprising a first conductive layer formed on the substrate, having a first end portion and an opposite, second end portion defining a body portion therebetween, wherein the body portion has a first thickness, H1, and each of the first and second end portions has a second thickness, H2, being variable along the transverse direction and satisfying with the relationship of H1≧H2>0, an active layer formed on the first conductive layer and extending onto the substrate at the first and second end portions such that the interface between the first conductive layer and the substrate is not exposed to a surrounding environment, and a second conductive layer at least partially formed on the active layer.

In one embodiment, each of the first and second end portions of the first conductive layer of each photovoltaic cell has a sloped profile, where the sloped portion comprises a rounded profile. The first conductive layer of each photovoltaic cell comprises a transparent conducting oxide (TCO).

In one embodiment, the active layer of each photovoltaic cell has a first end portion and an opposite, second end portion defining a body portion therebetween, where at least one of the first and second end portions has a sloped profile.

In one embodiment, the second conductive layer of each photovoltaic cell has a first end portion and an opposite, second end portion defining a body portion therebetween, where at least one of the first and second end portions has a sloped profile.

In one embodiment, the photovoltaic module also has a protection layer formed on the second conductive layers of the plurality of photovoltaic cells and extending onto the exposed portions of the substrate such that each photovoltaic cell is hermetically sealed from the surrounding environment, where the protection layer comprises silicon oxide, silicon nitride, silicon oxynitride, silicon carbide, or a combination thereof.

In yet a further aspect, the present invention relates to a method of forming a photovoltaic module on a substrate. In one embodiment, the method has the step of forming a first conductive layer on the substrate, and scribing the first conductive layer to form a plurality of first windows exposing a first portion of the substrate, each first window having a first width, forming an active layer on the first conductive layer and on the first portion of the substrate that is exposed by the plurality of first windows, forming a second conductive layer on the active layer, and scribing the active layer and the second conductive layer to form a plurality of second windows exposing a second portion of the substrate, each second window having a second width that is narrower than the first width of each first window, wherein each second window is located within a respective first window.

In one embodiment, the step of scribing the first conductive layer is performed such that an edge portion with a sloped profile is formed in the first conductive layer at a border thereof. A rounded portion of the sloped profile has a radius of curvature that is greater than about one third of the thickness of the first conductive layer. In another embodiment, the step of scribing the first conductive layer is performed to define a number of segments of the first conductive layer. Each segment has a first end portion and an opposite, second end portion defining a body portion therebetween. The body portion has a first thickness, H1, and at least one of the first and second end portions has a second thickness, H2, being variable and satisfying with the relationship of H1≧H2>0.

In one embodiment, the step of scribing the first conductive layer is performed by laser scribing using a laser beam with a tapered profile.

Additionally, the method further comprises the step of, after the step of scribing the first conductive layer and before the step of forming the active layer, etching an edge of the first conductive layer formed by the step of scribing the first conductive layer, such that the edge has a sloped profile.

The method may also has the step of, after the step of scribing the active layer and the second conductive layer, forming a protection layer on the second conductive layer and on the second portion of the substrate that is exposed by the plurality of second windows such that the photovoltaic module is hermetically sealed from a surrounding environment.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
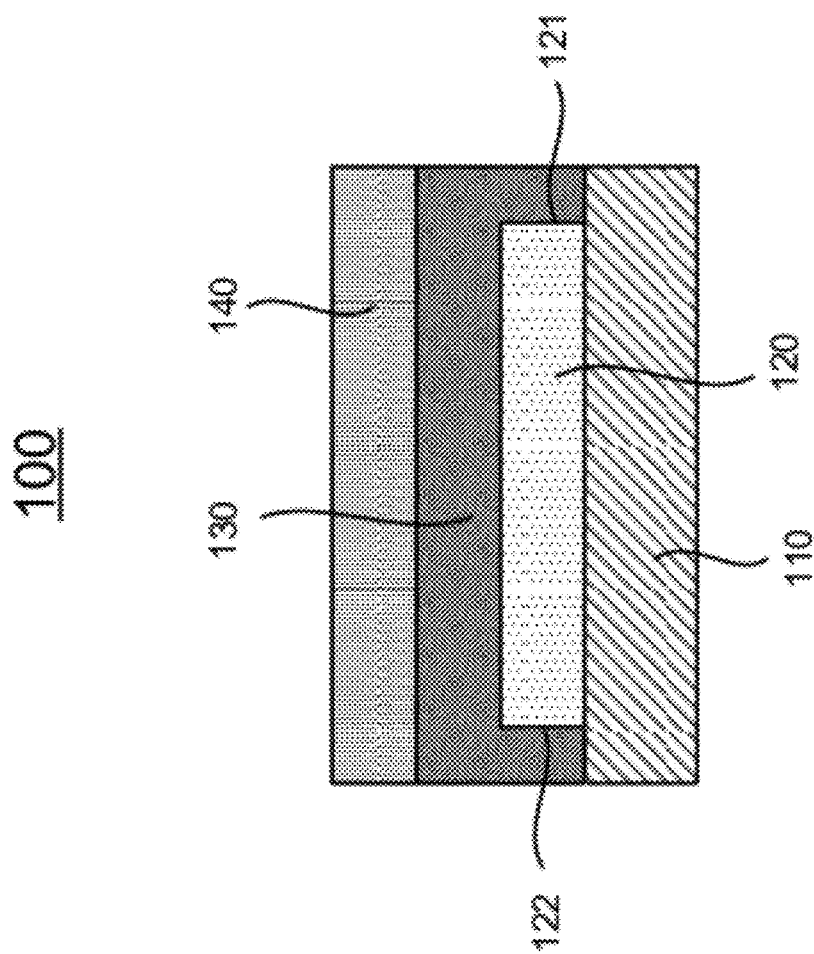
FIG. 1 shows schematically a cross sectional view of a thin film photovoltaic device according to one embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed as a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top," and "front" or "back" may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The term "substrate", as used herein, refers to a thin layer of material such as silicon, silicon dioxide, aluminum oxide, sapphire, germanium, gallium arsenide (GaAs), an alloy of silicon and germanium, indium phosphide (InP), glass, plastic, metal, etc., upon which a semiconductor device, e.g. a photovoltaic cell is applied.

As used herein, the term "plurality" means a number greater than one.

The description will be made as to the embodiments of the present invention in conjunction with the accompanying drawings in FIGS. 1-9. In accordance with the purposes of this invention, as embodied and broadly described herein, this invention, in one aspect, relates to a thin film photovoltaic device.

FIG. 1 shows schematically a cross sectional view of a photovoltaic device 100 according to one embodiment of the present invention. The photovoltaic device 100 has a substrate 110, a front (first) conductive layer 120 formed on the substrate 110 with two edges (or end portions) 121 and 122 each at a boundary, an active layer 130 formed on the front conductive layer 120, and a back (second) conductive layer 140 formed on the active layer 130. The active layer 130 extends from the front conductive layer 120 onto the substrate 110 at the two edges 121 and 122 of the front conductive layer 120 such that the interface between the front conductive layer 120 and the substrate 110 is not exposed to a surrounding environment, therefore preventing moisture in the environment from entering the interface to cause corrosion.

In one embodiment, the front conductive layer 120 may have a rectangular or square shape with four straight edges 122. In other embodiments, the front conductive layer 120 may have other geometrical shapes such as a circular, oval, or polygonal shape.

The substrate 110 may comprise glass. The front conductive layer 120 may comprise a transparent conducting oxide (TCO), such as but not limited to indium tin oxide (ITO), indium zinc oxide (IZO), indium tin zinc oxide (ITZO), zinc oxide (ZO), aluminum tin oxide (ATO), aluminum zinc oxide (AZO), cadmium indium oxide (CIO), cadmium zinc oxide (CZO), gallium zinc oxide (GZO), or fluorine tin oxide (FTO). The back conductive layer 130 may comprise a TCO or a metal such as but not limited to Mo, Ti, Ni, Al, Au, or Ag. The active layer 140 may comprise a semiconductor thin film in Group IV elements of the periodic table, Group III-V compound semiconductor thin film, Group II-VI compound semiconductor thin film, or organic semiconductor thin film. In details, the semiconductor thin film in Group IV elements of the periodic table is at least one of a carbon thin film, a silicon thin film, a germanium thin film, a silicon carbide thin film and a silicon germanium thin film, each of which may be in monocrystalline form, polycrystalline form, amorphous form or microcrystalline form, or a combination thereof. The compound semiconductor thin film in Group III-V of the periodic table is at least one of gallium arsenide (GaAs) thin film and indium gallium phosphide (InGaP) thin film, or a combination thereof. The compound semiconductor thin film in Group II-VI includes at least one of a copper indium diselenide (CIS) thin film, a copper indium gallium diselenide (CIGS) thin film and a cadmium telluride (CdTe) thin film, or a combination thereof. The organic compound semiconductor thin film can be a mixture of a conjugated polymer donor and PCBM acceptor. In addition, the active layer 140 may comprise a single PN junction composed of p-type semiconductor and n-type semiconductor or a single PIN junction composed of p-type semiconductor, intrinsic layer and n-type semiconductor. However, the present invention is not limited thereto. In another embodiment, the active layer 140 may comprise a stacked structure of a tandem junction, a triple junction or more than three-layers of photoelectric conversion film structure.

In a typical manufacturing process according to one embodiment of the present invention, a front conductive layer 120 is deposited on a substrate 110 using a thin film deposition technique such as chemical vapor deposition (CVD). Then, the front conductive layer 120 is scribed using laser scribing or mechanical scribing to define a boundary with the edges 121 and 122. Next, an active layer 130 and a back conductive layer 140 are sequentially deposited using CVD or other deposition techniques.

The manufacturing process as described above often results in a rather abrupt step edge 122 at a boundary of the front conductive layer 120. It has been observed that incomplete coverage of the edges 121 and 122 by the active layer 130 often occurs at a sharp corner of the edge 121 and 122.

Figure 2:
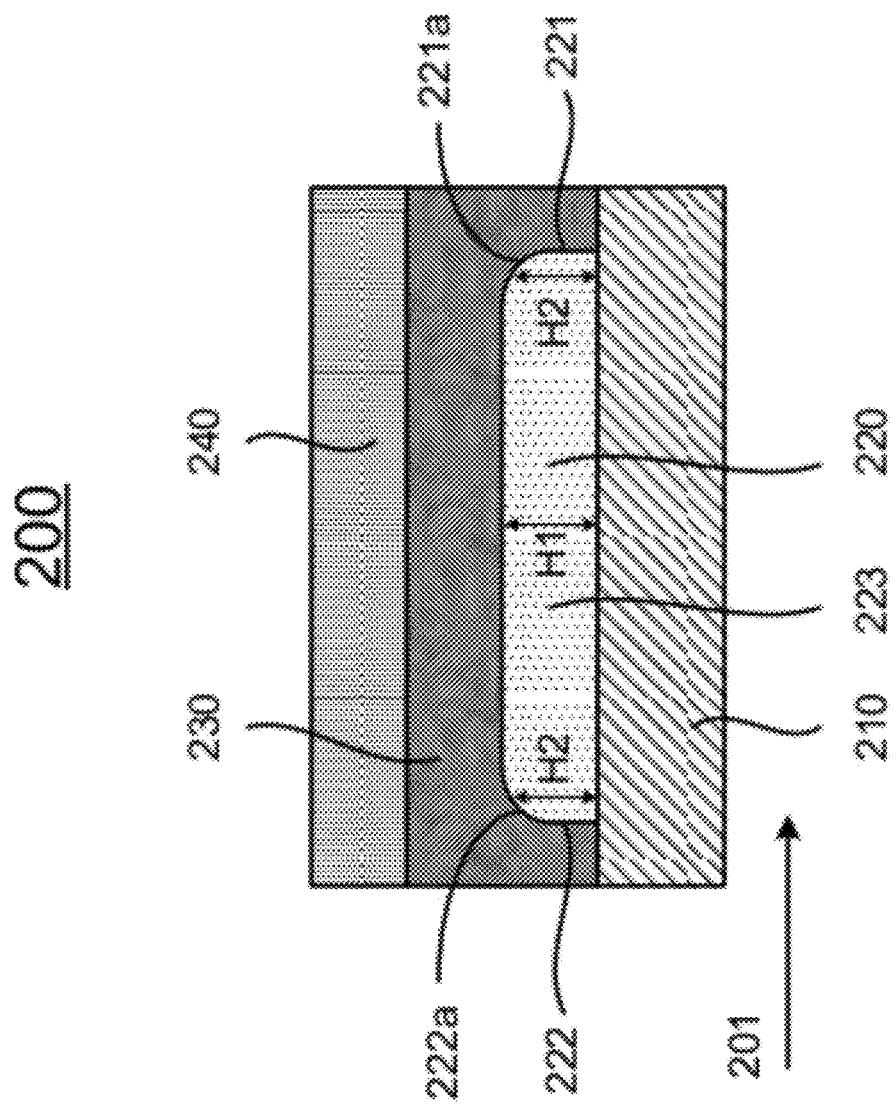
FIG. 2 shows schematically a cross sectional view of a thin film photovoltaic device according to another embodiment of the present invention.

FIG. 2 shows schematically a cross sectional view of a thin film photovoltaic device 200 according to another embodiment of the present invention that overcomes this problem. Similar to the photovoltaic device 100, the photovoltaic device 200 has a front conductive layer 220 formed, along a transverse direction 201, on a substrate 210. The front conductive layer 220 has a first end portion 221 and an opposite, second end portion 222 defining a body portion 223 therebetween. The body portion 223 has a first thickness, H1. The first and second end portions 221 and 222 have a second thickness, H2. The second thickness H2 is variable along the transverse direction 201 and satisfies with the relationship of H1≧H2>0. In one exemplary embodiment, each of the first and second end portions 221 and 222 of the front conductive layer 220 has a sloped profile 221a (222a). More specifically, for the embodiment shown in FIG. 2, the sloped portion 221a (222a) comprises a rounded profile.

The photovoltaic device 200 also has an active layer 230 formed on the front conductive layer 220 and extending onto the substrate 210 at the first and second portions 221 and 222, and a back conductive layer 240 formed on the active layer 230.

In this embodiment, the second thickness H2 of first and second end portions 221 and 222 of the front conductive layer 220 is variable from the first thickness H1 to zero so as to define a sloped or rounded profile thereon, which facilitates a better coverage of the edges 221a and 222a by the active layer 230 during the subsequent deposition. The sloped edges 221a and 222a can be formed by laser scribing using a laser beam with a tapered profile, or by using other methods such as etching. In other embodiment, the sloped profile of the edges 221a and 222a are approximately a rounded step function. In another embodiment, the rounded portion of the sloped profile has a radius of curvature that is greater than about one third of the first thickness H1 of the front conductive layer 220.

It is noted that in this and some other embodiments of the present invention, the sloped profile is formed such that a first order derivative exists when the thickness is changed from H1 to H2 with respect to a corresponding change along the direction 201, or vice versus from H2 to H1.

Figure 3:
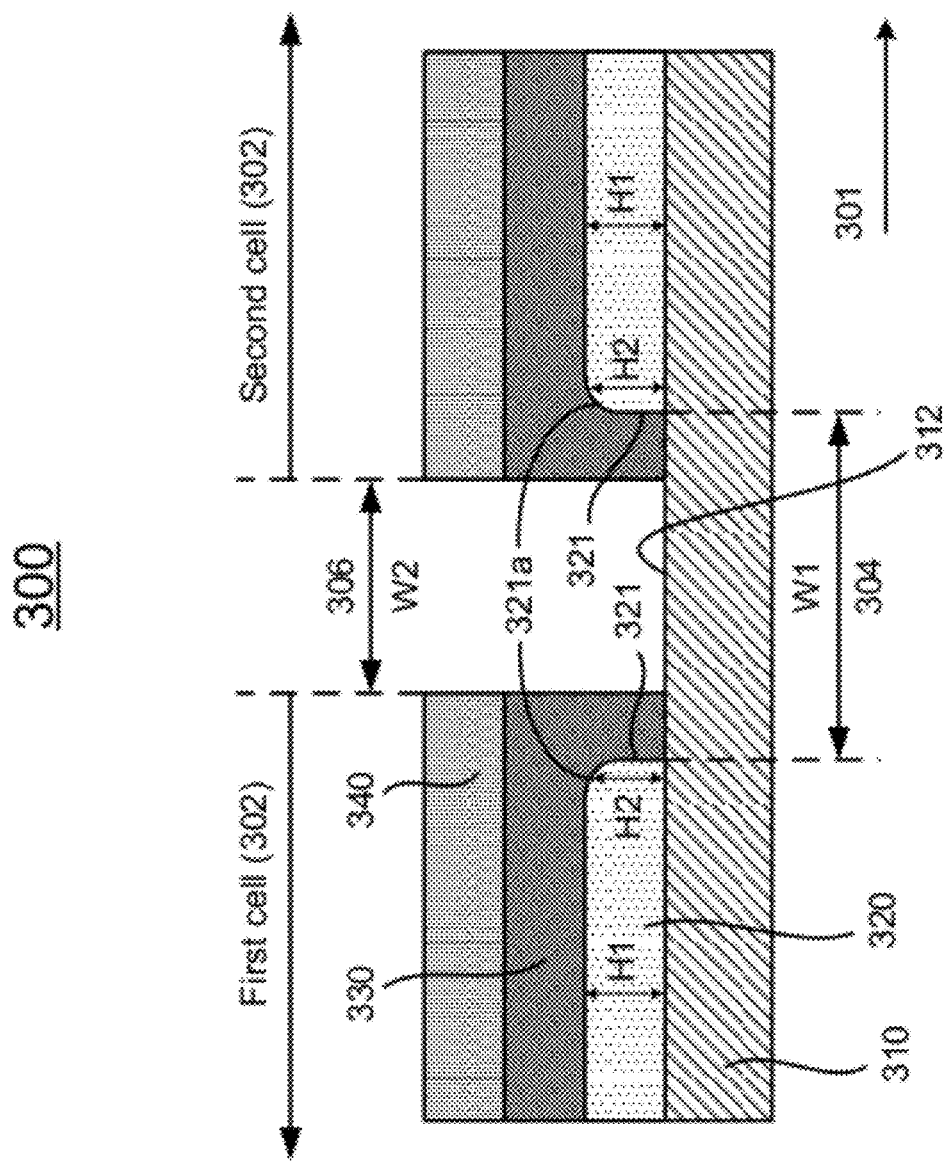
FIG. 3 shows schematically a partial cross sectional view of a thin film photovoltaic module according to one embodiment of the present invention.

FIG. 3 shows a partial cross sectional view of a thin film photovoltaic module 300 according to one embodiment of the present invention. The photovoltaic module 300 includes a plurality of photovoltaic cells 302 spatially formed on a substrate 310 in an array along a transverse direction 301. In the exemplary embodiment, only two photovoltaic cells 302, a first cell and a second cell, are shown. Each photovoltaic cell 302 includes a front conductive layer 320 formed on the substrate 310. The front conductive layer 320 has a body portion 333 with a first thickness H1 and at least one end portion 331 with a second thickness H2 that is variable from the first thickness H1 along the transverse direction and satisfies with the relationship of H1≧H2>0.

Each photovoltaic cell 302 also includes an active layer 330 formed on the active layer 320 and extending onto the substrate 310 at the at least one end portion 331, and a back conductive layer 340 formed on the active layer 330.

In this example shown in FIG. 3, each two neighboring cells 302 are spatially separated by a gap (or window) 306 therebetween, which exposes a portion 312 of the substrate 310 between the two neighboring cells 302 The front conductive layer 320 of each cell 302 has at least one sloped or rounded edge 321a at the variable thick end portion 331 that is adjacent to a respective window 306 and is covered by the active layer 330 of the corresponding cell, so that the interface between the front conductive layer 320 and the substrate 310 is hermetically sealed from the environment to prevent moisture from entering the interface. The cells 302 are electrically coupled to each other in series or in parallel.

In a typical manufacturing process according to one embodiment of the present invention, first, a front conductive layer 320 is deposited on the substrate 310. Second, the front conductive layer 320 is scribed by using laser scribing or mechanical scribing to create a plurality of first windows 304 exposing a first portion of the substrate 310 to separate the cells 302. Third, an active layer 330 is deposited on the first conductive layer 320 and on the first portion of the substrate 310 that is exposed by the plurality of first windows 304. Fourth, a back conductive layer 340 is deposited on the active layer 330. Fifth, the active layer 330 and the back conductive layer 340 are scribed to create a plurality of second windows 306 exposing a second portion 312 of the substrate 310 to separate the cells 302. Each second window 306 has a width W2 that is narrower or smaller than the width W1 of each first window 304 and is located within a respective first window 304. In one embodiment, the front conductive layer 320 is scribed by laser scribing using a laser beam with a tapered profile to form a sloped or rounded edge 321a in the front conductive layer 320. In another embodiment, after the front conductive layer 320 is scribed, etching is performed to form a sloped or rounded edge 321a in the front conductive layer 320.

In one embodiment, the photovoltaic module 300 may also have a protection layer (not shown) formed on the second conductive layers 340 of the plurality of photovoltaic cells 302 and extending onto the exposed portions 312 of the substrate 310 such that each photovoltaic cell 302 is hermetically sealed from the surrounding environment. The protection layer is formed of silicon oxide, silicon nitride, silicon oxynitride, silicon carbide, or the like.

Figure 4:
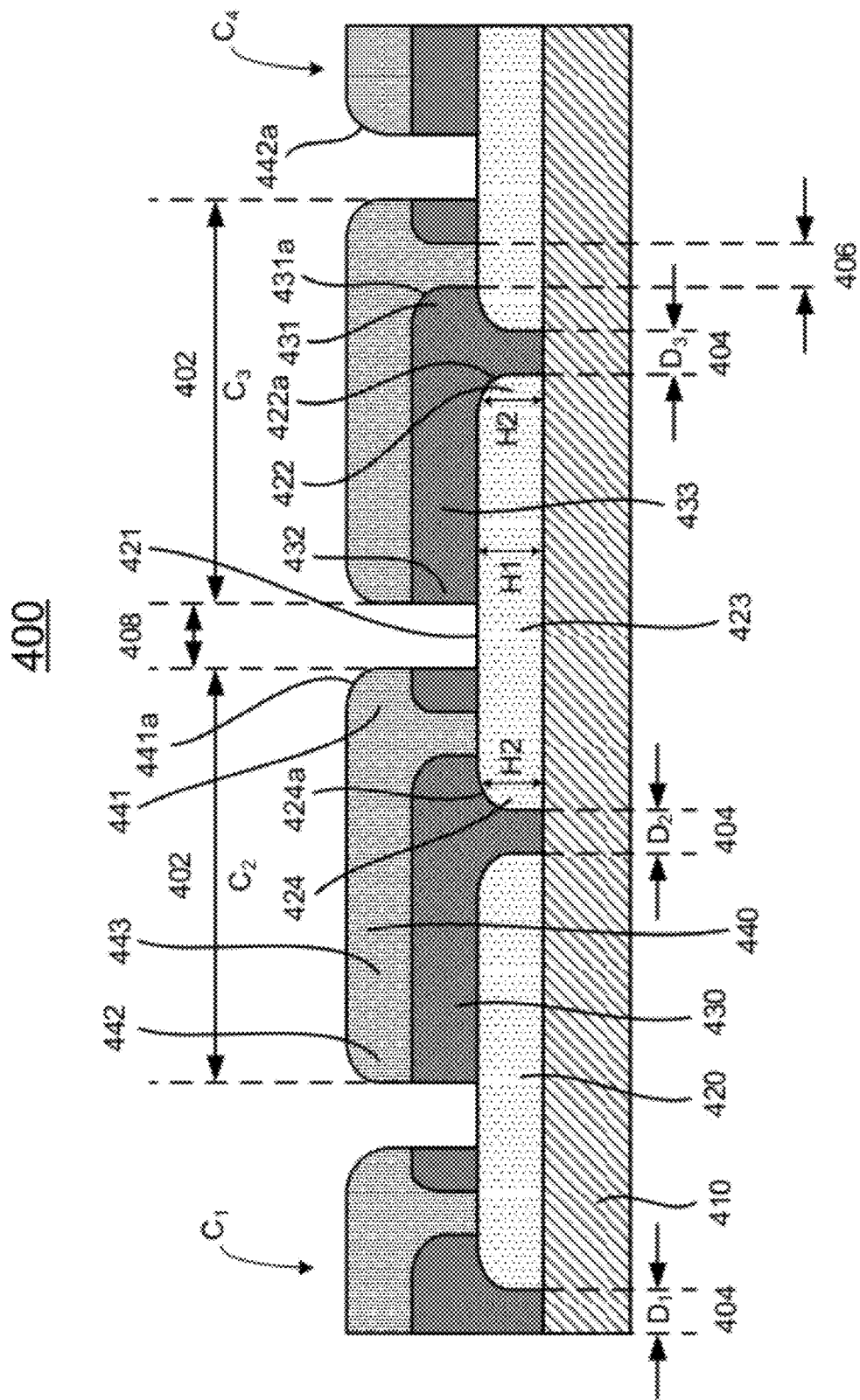
FIG. 4 shows schematically a partial cross sectional view of a thin film photovoltaic module according to one embodiment of the present invention.

FIG. 4 shows a partial cross sectional view of a thin film photovoltaic module 400 according to another embodiment of the present invention. The thin film photovoltaic module 400 includes a plurality of photovoltaic cells $\{C_j\}$ 402 formed on a substrate 410, where j=1, 2, 3, . . . , N and N is an integer greater than one. The plurality of photovoltaic cells $\{C_j\}$ 402 is spatially arranged as a linear array along a transverse direction 401. In this example, N=4. Each photovoltaic cell 402, e.g., $C_1$, $C_2$, $C_3$ or $C_4$, has a front conductive layer 420 formed on the substrate 410, an active layer 430 at least partially formed on the front conductive layer 420, and a back conductive layer 440 at least partially formed on the active layer 430. In the embodiment, shown in FIG. 4, the front conductive layer 420 has a first end portion 422 and an opposite, second end portion 424 defining a body portion 423 therebetween. The body portion 423 has a constant thickness H1. The first and second end portions 422 and 424 have a variable thickness H2 that is variable along the transverse direction 401 and satisfies with the relationship of H1≧H2>0. In one embodiment, the first and second end portions 422 and 424 of the first conductive layer 420 have a sloped profile 422a and 424a, respectively. The sloped portions 422a and 424a have a rounded profile.

As shown in FIG. 4, the first conductive layer 420 of the first photovoltaic cell 402 ($C_1$) is spatially separated from that of the second photovoltaic cell 402 ($C_2$) by a window (or gap) 404 with a width $D_1$, which, in turn, is spatially separated from that of the third photovoltaic cell 402 ($C_3$) by a window/gap 404 with a width $D_2$, which, in turn, is spatially separated from that of the fourth photovoltaic cell 402 ($C_4$) by a window/gap 404 with a width $D_3$. The widths $D_1$, $D_2$, and $D_3$ are the same, i.e., $D_1$=$D_2$=$D_3$.

Further, the active layer 430 extends from the front conductive layer 320 onto the substrate 410 at the variable thick end portions 422 and 424, so that the interface between the first conductive layer 420 and the substrate 410 is not exposed to the surrounding environment to prevent moisture from entering the interface.

Additionally, the active layer 430 of each photovoltaic cell 402 has a first end portion 431 and an opposite, second end portion 432 defining a body portion 433 therebetween, where at least one of the first and second end portions 431 and 432 has a sloped profile 431a. The second conductive layer 440 of each photovoltaic cell 402 has a first end portion 441 and an opposite, second end portion 442 defining a body portion 443 therebetween, where at least one of the first and second end portions 441 and 442 has a sloped profile 441a.

As such a thin film photovoltaic module 400, the active layer 430 and the second conductive layer 440 of any one but the last photovoltaic cell 402 (e.g., $C_1$, $C_2$, or $C_3$) are spatially separated from that of the immediately next photovoltaic cell 402 (e.g., $C_2$, $C_3$ or $C_4$) by a window (or gap) 408 that exposes a portion of the first conductive layer 421 of the immediately next photovoltaic cell 402. The plurality of photovoltaic cells 402 are connected to each other in series such that the back conductive layer 440 of any photovoltaic cell but the last photovoltaic cell 402 (e.g., $C_1$, $C_2$, or $C_3$) is connected to the front conductive layer 420 of an immediately next photovoltaic cell 402 (e.g., $C_2$, $C_3$ or $C_4$). In the exemplary embodiment, each connection is through a respective window 406 defined in the active layer 430 of the corresponding photovoltaic cell 402.

Figure 5:
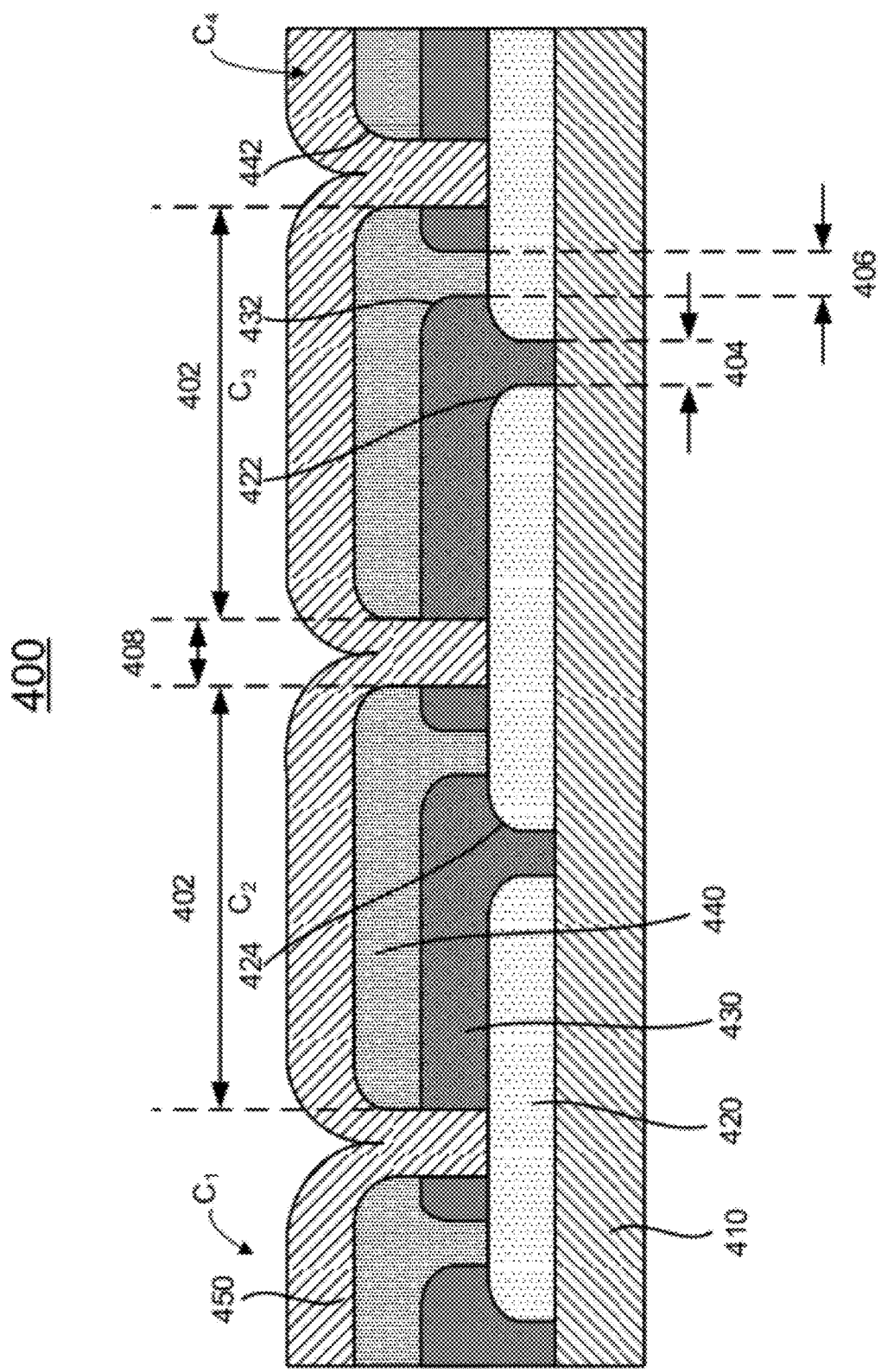
FIG. 5 shows schematically a partial cross sectional view of a thin film photovoltaic module according to another embodiment of the present invention.

The thin film photovoltaic module 400 may further include a protection layer 450 formed over the plurality of cells 402, as shown in FIG. 5, so that the plurality of photovoltaic cells 402 are hermetically sealed from the surrounding environment to further protect the thin film photovoltaic module 100 from moisture ingression. The protection layer 450 may comprise silicon oxide, silicon nitride, silicon oxynitride, silicon carbide, or a combination thereof. The protection layer 450 may be formed by using CVD or other deposition techniques, or by oxidation or nitration of a top region of the second conductive layer 440.

Figure 6:
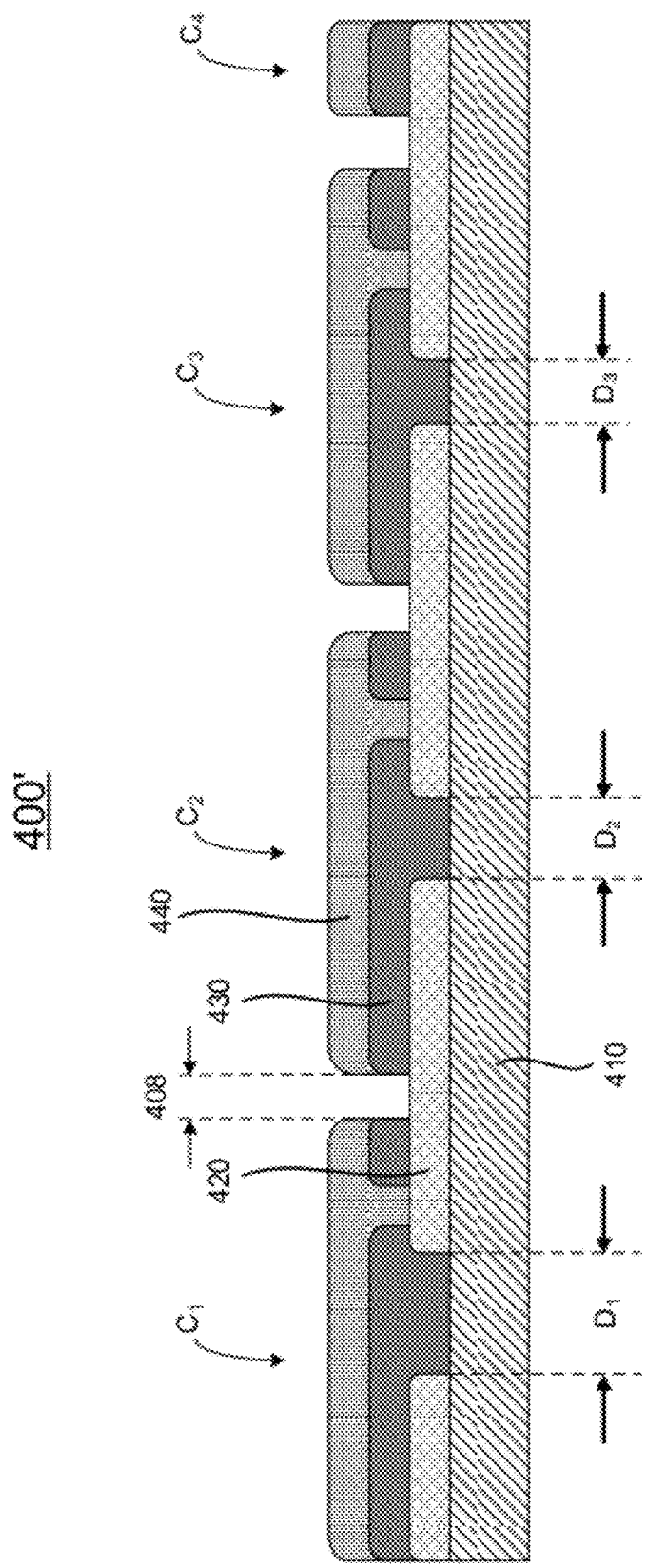
FIG. 6 shows schematically a partial cross sectional view of a thin film photovoltaic module according to one embodiment of the present invention.
Figure 7:
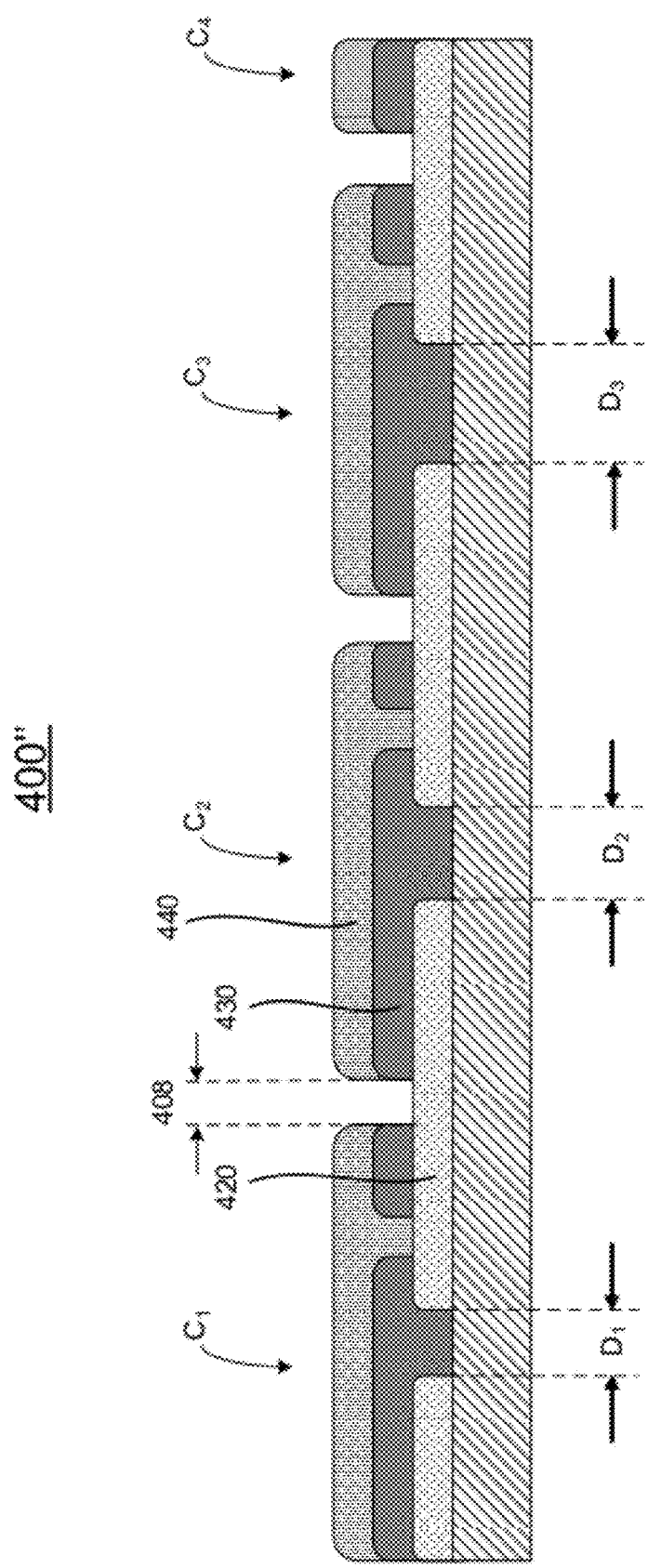
FIG. 7 shows schematically a partial cross sectional view of a thin film photovoltaic module according to another embodiment of the present invention.

In a typical manufacturing process according to one embodiment of the present invention, first, a front conductive layer 420 is formed on the substrate 410. Second, the front conductive layer 420 is scribed to form a plurality of first windows 404 exposing a portion of the substrate 410 to separate the cells 402. Each of the plurality of first windows 404 may have the same width or a width that is different from the others, where the latter is shown in FIGS. 6 and 7. Third, an active layer 430 is at least partially formed on the first conductive layer 420. Fourth, the active layer 430 is scribed to form a plurality of second windows 406. Each second window 406 exposes a first portion of the front conductive layer 420 of a respective cell 402 to facilitate the connection between the back conductive layer 440 of the respective cell 402 and the front conductive layer 420 of the immediately next cell 402. Fifth, a back conductive layer 440 is at least partially formed on the active layer 430. Sixth, the back conductive layer 440 and the active layer 430 are scribed to form a plurality of third windows 408 to separate the cells 402. Each third window 408 exposes a second portion of the front conductive layer 420 of a respective cell 402. In one embodiment, a tapered or rounded profile of each of the edges 421a, 432a, and 441a is formed by laser scribing using a laser beam with a tapered profile or by etching. In another embodiment, a protection layer 450 is formed last over the plurality of cells 402.

FIGS. 6 and 7 show thin film photovoltaic modules 400' and 400" of two embodiments of the present invention, respectively. Both the thin film photovoltaic modules 400' and 400" are substantially similar to the thin film photovoltaic modules 400 as shown in FIG. 4, except that the widths of the first windows satisfy the relationship of $D_1 > D_2 > D_3$ in the thin film photovoltaic modules 400', while $D_1 < D_2 < D_3$ in the thin film photovoltaic modules 400".

Figure 8:
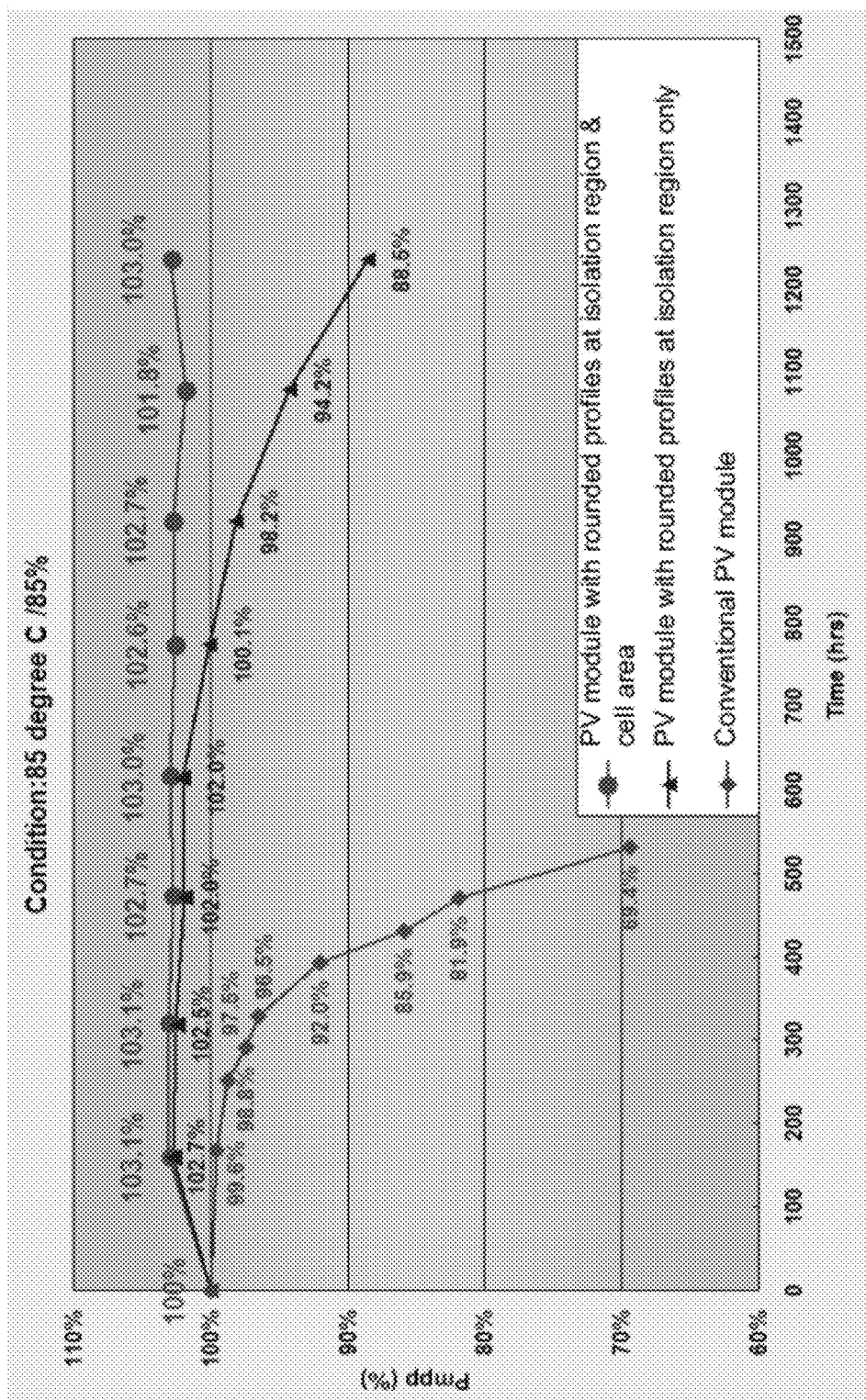
FIG. 8 shows the position of maximum power point ($P_{MPP}$) as a function of test time for various thin film photovoltaic modules according to various embodiments of the present invention in comparison to the that of a conventional thin film photovoltaic module.
Figure 9:
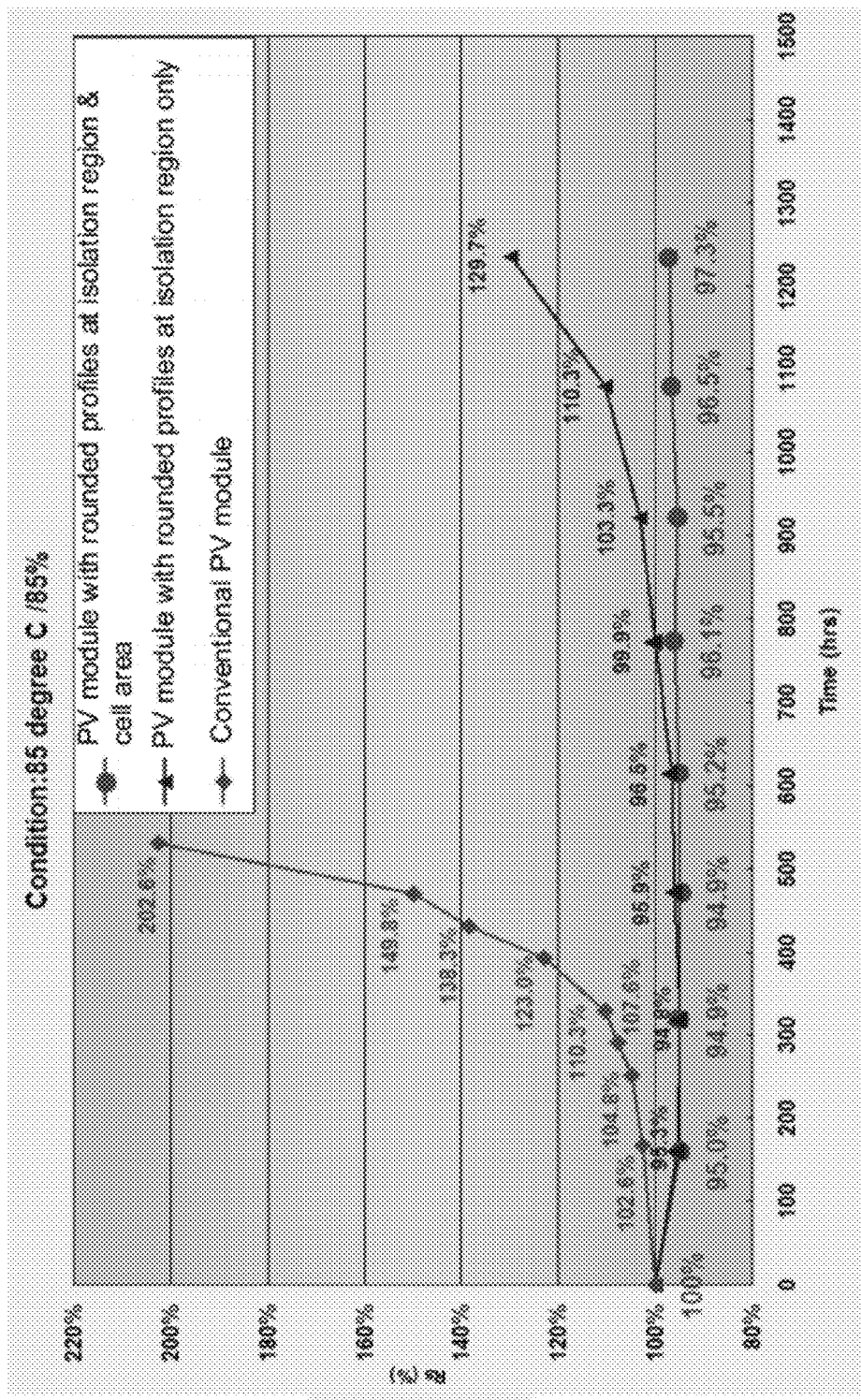
FIG. 9 shows the series resistance ($R_S$) as a function of test time for various thin film photovoltaic modules according to various embodiments of the present invention in comparison to that of a conventional thin film photovoltaic module.

FIGS. 8 and 9 show, respectively, the position of maximum power point ($P_{MPP}$) and series resistance ($R_S$) as a function of test time for two thin film photovoltaic modules according to various embodiments of the present invention, as well as for a conventional thin film photovoltaic module. The thin film photovoltaic modules under test were subjected to an ambient temperature of 85° C. and 85% humidity. The triangles are the test results for a thin film photovoltaic module according to an embodiment similar to that shown in FIG. 3 where the edge 322 of the front conductive layer 320 in each cell 302 has a sloped or rounded profile. As can be seen, for this thin film photovoltaic module, the $P_{MPP}$ does not show significant decrease and $R_S$ does not show significant increase until after about 900 hours of testing. This is a significant improvement in reliability performance compared to that of a conventional thin film photovoltaic module (diamonds) where a significant decrease in $P_{MPP}$ and a significant increase in $R_S$ are observed after less than 300 hours of testing. The circles are the test results for a thin film photovoltaic module according to another embodiment similar to that shown in FIG. 4 where each of the edges 422/424, 432, and 442 of the front conductive layer 420, the active layer 430, and the back conductive layer 440 has a sloped or rounded profile. As can be seen, the reliability performance is further improved in this photovoltaic module where $P_{MPP}$ does not show any significant decrease and $R_S$ does not show any significant increase even after more than 1200 hours of testing. These test results demonstrate that the thin film photovoltaic modules according various embodiments of the present invention are more resistant to corrosion and have better reliability performance compared to conventional thin film photovoltaic modules. The thin film photovoltaic modules according to the present invention can be manufactured using existing manufacturing tools with only minor modifications. The installation of these thin film photovoltaic modules can also be cost effective because it is no longer necessary to use negative grounding and transformerless inverters can be used.

In one aspect, the present invention also relates to a method of forming a photovoltaic module on a substrate. The method in one embodiment has the following steps: at first, a first conductive layer is formed on the substrate. Then, the formed first conductive layer is scribed to define a plurality of first windows exposing a first portion of the substrate. Each first window has a first width. Next, an active layer is formed on the first conductive layer and on the first exposed portion of the substrate. Afterward, a second conductive layer is formed on the active layer. Subsequently, the active layer and the second conductive layer are scribed to define a plurality of second windows exposing a second portion of the substrate. Each second window has a second width that is narrower than the first width of each first window. Each second window is located within a respective first window.

In one embodiment, the step of scribing the first conductive layer is performed such that an edge portion with a sloped profile is formed in the first conductive layer at a border thereof. A rounded portion of the sloped profile has a radius of curvature that is greater than about one third of the thickness of the first conductive layer. In another embodiment, the step of scribing the first conductive layer is performed to define a number of segments of the first conductive layer. Each segment has a first end portion and an opposite, second end portion defining a body portion therebetween. The body portion has a first thickness, H1, and at least one of the first and second end portions has a second thickness, H2, being variable and satisfying with the relationship of $H1 \geq H2 > 0$.

In one embodiment, the step of scribing the first conductive layer is performed by laser scribing using a laser beam with a tapered profile.

Additionally, the method further comprises the step of, after the step of scribing the first conductive layer and before the step of forming the active layer, etching an edge of the first conductive layer formed by the step of scribing the first conductive layer, such that the edge has a sloped profile.

The method may also has the step of, after the step of scribing the active layer and the second conductive layer, forming a protection layer on the second conductive layer and on the second portion of the substrate that is exposed by the plurality of second windows such that the photovoltaic module is hermetically sealed from a surrounding environment.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A photovoltaic module, comprising:
   a plurality of photovoltaic cells, $\{C_j\}$, spatially formed on a substrate in an array along a transverse direction, j=1, 2, 3, . . . , N, N being an integer greater than one, each photovoltaic cell $C_j$ comprising:
   (a) a first conductive layer formed on the substrate, having a first end portion and an opposite, second end portion defining a body portion therebetween, wherein the body portion has a first thickness, H1, and at least one end portion of the first and second end portions has a second thickness, H2, being variable along the transverse direction and satisfying with the relationship of $H1 \geq H2 > 0$;
   (b) an active layer at least partially formed on the first conductive layer and extending onto the substrate at the at least one end portion of the first conductive layer; and
   (c) a second conductive layer at least partially formed on the active layer, wherein the active layer and the second conductive layer of any one but the last photovoltaic cell $C_k$ are spatially separated from that of its immediately next photovoltaic cell $C_{k+1}$ by a window that exposes a portion of the first conductive layer of the immediately next photovoltaic cell $C_{k+1}$, k=1, 2, 3, . . . , (N−1);
   wherein the plurality of photovoltaic cells is electrically coupled to each other in series such that the second conductive layer of any one but the last photovoltaic cell $C_k$ is electrically connected to the first conductive layer of its immediately next photovoltaic cell $C_{k+1}$; and
   wherein the first conductive layer of any one but the last photovoltaic cell $C_k$ is spatially separated from that of its immediately next photovoltaic cell $C_{k+1}$ by a distance $D_k$, wherein $D_1 > D_2 > D_3 > \ldots > D_{N-1}$ or $D_1 < D_2 < D_3 < \ldots < D_{N-1}$; and a protection layer formed on the second conductive layers and extending onto the exposed portions of the first conductive layers of the plurality of photovoltaic cells $\{C_j\}$ such that each photovoltaic cell $C_j$ is hermetically sealed from a surrounding environment.

2. The photovoltaic module of claim 1, wherein the at least one end portion of the first conductive layer of each photovoltaic cell $C_j$ has a sloped profile.

3. The photovoltaic module of claim 2, wherein the sloped profile comprises a rounded profile.

4. A photovoltaic module, comprising:

a plurality of photovoltaic cells, $\{C_j\}$, spatially formed on a substrate in an array along a transverse direction, $j=1, 2, 3, \ldots, N$, N being an integer greater than one, each photovoltaic cell $C_j$ comprising:

(a) a first conductive layer formed on the substrate, having a first end portion and an opposite, second end portion defining a body portion therebetween, wherein the body portion has a first thickness, H1, and at least one end portion of the first and second end portions has a second thickness, H2, being variable along the transverse direction and satisfying with the relationship of $H1 \geq H2 > 0$;

(b) an active layer at least partially formed on the first conductive layer and extending onto the substrate at the at least one end portion of the first conductive layer; and (c) a second conductive layer at least partially formed on the active layer, wherein the plurality of photovoltaic cells is electrically coupled to each other in series such that the second conductive layer of any one but the last photovoltaic cell $C_k$ is electrically connected to the first conductive layer of its immediately next photovoltaic cell $C_{k+1}$, $k=1, 2, 3, \ldots, (N-1)$; and wherein the first conductive layer of any one but the last photovoltaic cell $C_k$ is spatially separated from that of its immediately next photovoltaic cell $C_{k+1}$ by a distance $D_k$, wherein $D_1 > D_2 > D_3 > \ldots > D_{N-1}$ or $D_1 < D_2 < D_3 < \ldots < D_{N-1}$.

5. The photovoltaic module of claim 4, wherein the at least one end portion of the first conductive layer of each photovoltaic cell $C_j$ has a sloped profile.

6. The photovoltaic module of claim 5, wherein the sloped profile comprises a rounded profile.

7. The photovoltaic module of claim 4, wherein the active layer of each photovoltaic cell $C_j$ has a first end portion and an opposite, second end portion defining a body portion therebetween, and wherein at least one of the first and second end portions has a sloped profile.

8. The photovoltaic module of claim 4, wherein the second conductive layer of each photovoltaic cell $C_j$ has a first end portion and an opposite, second end portion defining a body portion therebetween, and wherein at least one of the first and second end portions has a sloped profile.

9. The photovoltaic module of claim 4, wherein the plurality of photovoltaic cells is formed such that the active layer and the second conductive layer of any one but the last photovoltaic cell $C_k$ are spatially separated from that of its immediately next photovoltaic cell $C_{k+1}$ by a window that exposes a portion of the first conductive layer of the immediately next photovoltaic cell $C_{k+1}$.

10. The photovoltaic module of claim 9, further comprising a protection layer formed on the second conductive layers and extending onto the exposed portions of the first conductive layers of the plurality of photovoltaic cells $\{C_j\}$ such that each photovoltaic cell $C_j$ is hermetically sealed from a surrounding environment.

11. The photovoltaic module of claim 10, wherein the protection layer comprises silicon oxide, silicon nitride, silicon oxynitride, silicon carbide, or a combination thereof.

12. The photovoltaic module of claim 4, wherein the first conductive layer of each photovoltaic cell $C_j$ comprises a transparent conducting oxide (TCO).

* * * * *